(12) United States Patent
Shin et al.

(10) Patent No.: US 8,723,706 B1
(45) Date of Patent: May 13, 2014

(54) MULTI-STEP ADC WITH SUB-ADC CALIBRATION

(75) Inventors: Soonkyun Shin, Lexington, MA (US); Dong-Young Chang, Brookline, MA (US); Matthew A. Z. Straayer, Acton, MA (US); Hae-Seung Lee, Lexington, MA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/597,075

(22) Filed: Aug. 28, 2012

(51) Int. Cl.
*H03M 1/06* (2006.01)

(52) U.S. Cl.
USPC .......................................... 341/118; 341/161

(58) Field of Classification Search
USPC .................. 341/144, 155, 118, 120, 156, 161
See application file for complete search history.

(56) References Cited

U.S. PATENT DOCUMENTS

| | | | |
|---|---|---|---|
| 5,606,320 A * | 2/1997 | Kleks | 341/161 |
| 6,351,231 B1 * | 2/2002 | Price et al. | 341/155 |
| 7,898,452 B2 * | 3/2011 | Lewis et al. | 341/161 |
| 8,466,700 B2 * | 6/2013 | Motz et al. | 324/750.07 |
| 2012/0049048 A1 * | 3/2012 | Dyer | 250/214 AL |
| 2013/0106628 A1 * | 5/2013 | Miller et al. | 341/110 |

OTHER PUBLICATIONS

D.Y. Chang, "Design techniques for a pipelined ADC without using a front-end sample-and-hold amplifier," IEEE Trans. Circuits Syst. I, Reg. Papers, 51(11):2123-2132, Nov. 2004.
Pingli Huang et al., "SHA-Less Pipelined ADC With in Situ Background Clock-Skew Calibration," Solid-State Circuits, IEEE Journal of , 46(8):1893-1903, Aug. 2011.
Lee, C.C.; Flynn, M.P.; , "A SAR-Assisted Two-Stage Pipeline ADC," Solid-State Circuits, IEEE Journal of , 46(4):859-869, Apr. 2011.

* cited by examiner

*Primary Examiner* — Peguy Jean Pierre
(74) *Attorney, Agent, or Firm* — North Weber & Baugh LLP

(57) ABSTRACT

Various embodiments of the invention allow for error calibration in analog-to-digital converters (ADCs) having multiple cascaded ADC stages. The ADC stages exchange information that is utilized in the calibration process. Various embodiments allow for calibration of one stage by utilizing a feedback signal from at least one subsequent stage. Certain embodiments of the invention increase the speed of the calibration process by utilizing coarse and fine sub-ADCs.

23 Claims, 12 Drawing Sheets

1100

| | After fine decision | | | | |
|---|---|---|---|---|---|
| $D_{FINE}[3:0]$ | $D_{Cs}[31]$ | $D_{Cs}[30]$ | $D_{Cs}[29:2]$ | $D_{Cs}[1]$ | $D_{Cs}[0]$ |
| 1111 | 1 | 1 | $D_{Cs}[29:28]=D_{COARSE}[14],$ | $D_{FINE}[0]$ | $D_{FINE}[0]$ |
| 0111 | 1 | $D_{COARSE}[15]$ | $D_{Cs}[27:26]=D_{COARSE}[13],$ | $D_{FINE}[0]$ | $D_{FINE}[0]$ |
| 0011 | $D_{COARSE}[15]$ | $D_{COARSE}[15]$ | ... | $D_{FINE}[0]$ | $D_{FINE}[0]$ |
| 0001 | $D_{COARSE}[15]$ | $D_{COARSE}[15]$ | $D_{Cs}[5:4]=D_{COARSE}[2],$ | $D_{FINE}[0]$ | 0 |
| 0000 | $D_{COARSE}[15]$ | $D_{COARSE}[15]$ | $D_{Cs}[3:2]=D_{COARSE}[1]$ | 0 | 0 |

FIGURE 11

MULTI-STEP ADC WITH SUB-ADC CALIBRATION

BACKGROUND

A. Technical Field

The present invention relates to analog-to-digital converters (ADC), and more particularly systems, devices, and methods that provide calibration for multi-stage ADCs.

B. Background of the Invention

Multi-step ADCs are an established architecture for the digitization of analog input signals and are often preferred for high-speed and high-resolution applications. In a pipeline ADC, the task of quantizing the input signal is distributed among multiple stages. Each stage has a sub-ADC that quantizes an input signal, a DAC that subtracts an estimate of the input signal, and a residue amplifier that amplifies the difference to be further processed by a subsequent stage. Together, the DAC and residue amplifier is known as a Multiplying DAC (MDAC). A large number of sub-ADC levels allow a large gain to be used in the first stage, which relaxes the first stage residue amplifier linearity requirements, reduces the number of stages, and suppresses the noise and errors of following stages significantly. In practical implementations, the sub-ADC suffers from static and dynamic inaccuracies that increase the output voltage range over which the residue amplifier must achieve a high level of accuracy. As a result, the practical number of quantization levels that are used in the MDAC is limited.

Traditionally, sub-ADC's in a pipeline ADC are implemented with a FLASH architecture to provide a moderate number of levels with a minimum amount of latency. Static sub-ADC errors in this approach arise from random and systematic comparator offset in the FLASH ADC. Random and systematic errors of the comparator reference voltages, e.g. errors in the reference ladder voltages give rise to similar sub-ADC errors, effectively resulting in additional comparator offset. Increasing the number of sub-ADC bits is desirable for performance reasons, but results in both in an increase in the number of comparators as well as an increase in the matching requirements. To maintain a reasonable amount of area and power consumption without calibration of each comparator's offset, the FLASH sub-ADC resolution is practically limited to about 4-bits. In addition to the static sub-ADC errors, there are also dynamic errors in the first stage's sub-ADC quantization due to timing and bandwidth mismatch between the input sampling of the sub-ADC and the MDAC.

As shown in prior art FIG. 1, a pipeline ADC front-end without a sample-and-hold amplifier (SHA) can save power, but the continuous-time to discrete-time sampling operation is performed onto both the sub-ADC and the MDAC capacitors. At high input frequencies, timing or bandwidth mismatch between the two paths will introduce a dynamic error that adds to the static mismatch error. In multistep or pipeline ADCs, over-range capability of the second and subsequent stages remove the errors caused by the timing and bandwidth mismatches provided the errors are within the over-range boundary. However, as with the FLASH comparator offsets, the timing and bandwidth errors increase the output voltage range of the residue amplifier. It has been shown that this timing and bandwidth error may be calibrated; however, this introduces additional complexity and does not address the static comparator offset.

What is needed are devices, methods and systems to overcome the above-described limitations.

SUMMARY OF THE INVENTION

Various embodiments of the invention allow for calibration of static and dynamic errors in ADCs having multiple cascaded ADC stages. The ADC stages exchange information that is utilized in the calibration process. In particular, certain embodiments of the invention provide for calibration of a stage by utilizing a feedback signal from at least one subsequent stage. In one embodiment, the feedback signal is generated by an immediately following stage that quantizes the output residue signal of the present stage.

This feedback signal can be analyzed relative to various attributes using various techniques known to one skilled in the art. In certain embodiments of the invention, the speed of the calibration process can be increased by utilizing a coarse sub-ADC that estimates the analog input voltage and a fine sub-ADC that compensates for the offset voltage.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. 11 is a table illustrating exemplary mapping of coarse and fine decisions to capacitor connections according to various embodiments of the invention.

DETAILED DESCRIPTION OF THE PREFERRED EMBODIMENTS

In the following description, for the purpose of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize additional modifications, applications, and embodiments are within the scope thereof, as are additional fields in which the invention may provide utility. Accordingly, the embodiments described below are illustrative of specific embodiments of the invention and are meant to avoid obscuring the invention.

Reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily all referring to the same embodiment.

Furthermore, connections between components or between method steps in the figures are not restricted to connections that are effected directly. Instead, connections illustrated in the figures between components or method steps may be modified or otherwise changed through the addition thereto of intermediary components or method steps, without departing from the teachings of the present invention.

Figure 1:
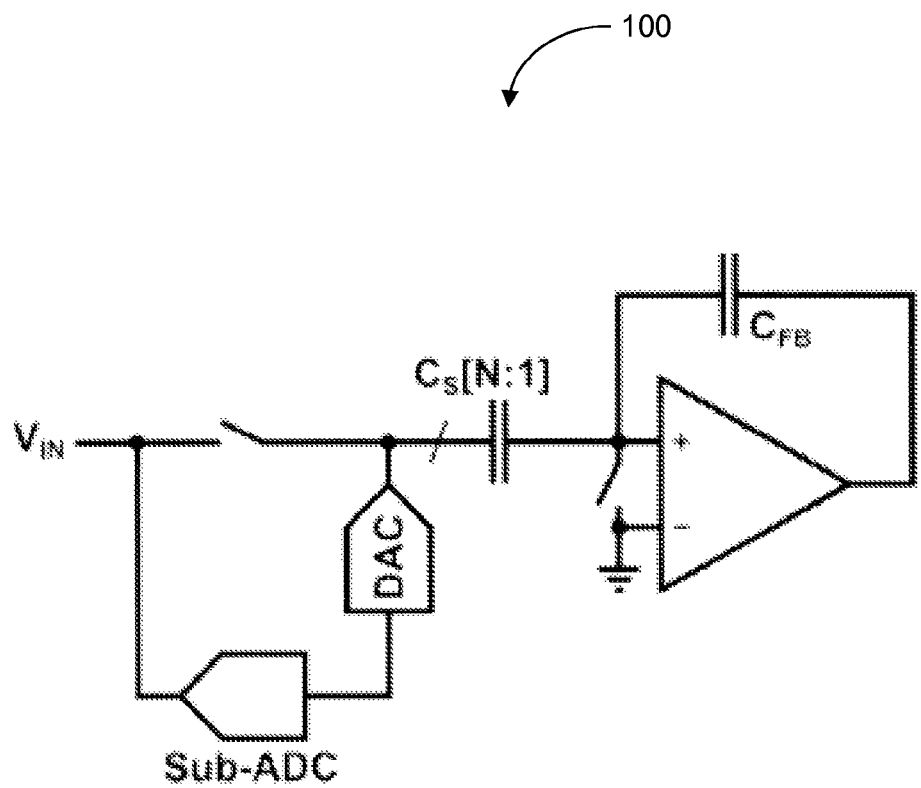
FIG. 1 is a block diagram of a prior art pipeline ADC stage 1 without sample-and-hold amplifier.

FIG. 1 is a block diagram of a prior art pipeline ADC stage 1 100 without sample-and-hold amplifier. For a pipeline stage with a 4-comparator FLASH and a gain of 2, the effect of a sub-ADC static error is shown in FIGS. 2A and 2B.

Figure 2A:
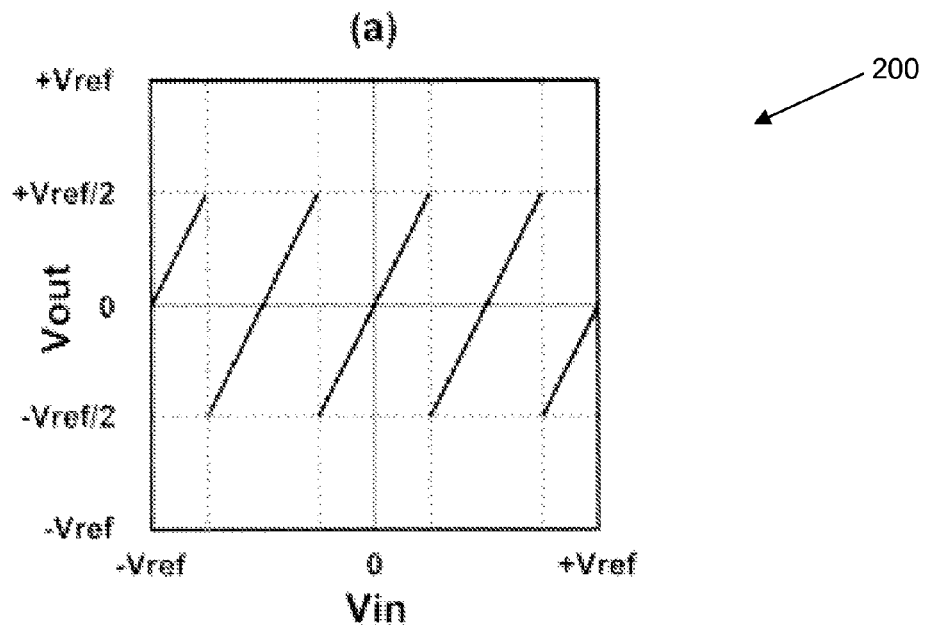
FIG. 2A is an exemplary residue plot for ideal comparator thresholds.

FIG. 2A is an exemplary residue plot 200 for ideal comparator thresholds. The four comparison thresholds are set such that the stage output voltage residue range is always between $\pm V_{REF}/2$.

Figure 2B:
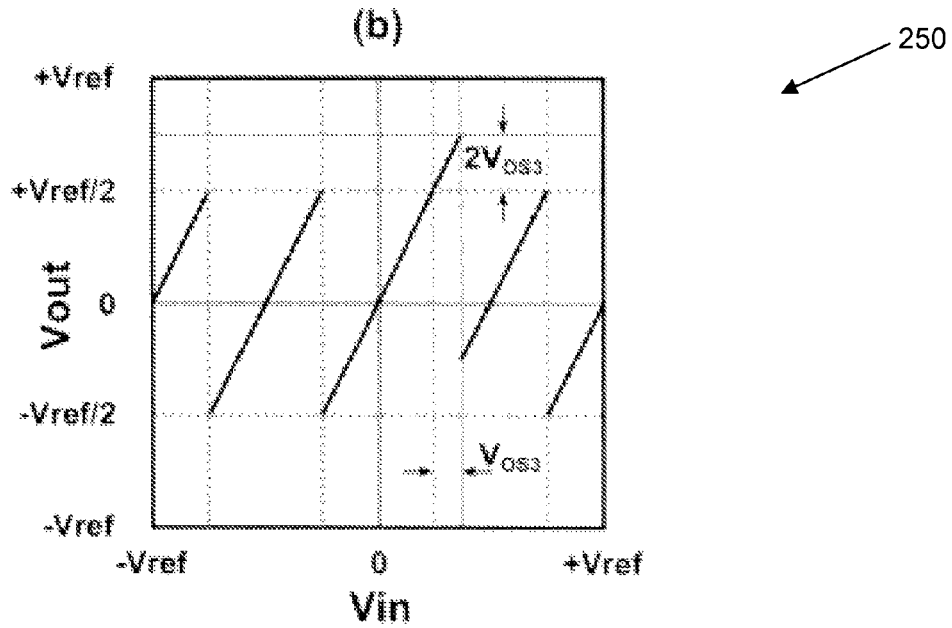
FIG. 2B is an exemplary residue plot showing the effect of an offset error on the residue plot.

FIG. 2B is an exemplary residue plot 250 showing the effect of a comparator offset on the residue plot. As shown, the third comparator threshold voltage is too large by an amount equal to $V_{OS3}$. In this case, the center residue region is extended from $-V_{REF}/2$ to $+V_{REF}/2+2V_{REF}/2$.

In one embodiment, the extension of the output residue beyond the ideal value of $+V_{REF/2}$ in FIG. 2B is detected by the combined digital output code of the subsequent ADC stages provided that the input signal has sampled voltage levels between $V_{REF}/4$ and $V_{REF}/4+V_{OS3}$. In the case that the digital output code exceeds a predetermined threshold, a control signal is fed back indicating that the third comparator offset is too high. With a simple DAC or other compensation for the effect of $V_{OS3}$, a digital register controlling this particular DAC may be appropriately incremented or decremented. Similarly, a control signal is fed back to indicate that a specific comparator threshold is too low, and the digital register for that threshold is then modified in the opposite direction. When no violations of the output voltage range are detected, the digital accumulators maintain their present value. In this manner, a negative feedback loop is created for each comparator to control their respective effective thresholds.

In the embodiment described above, the full digital output code from the subsequent stages is used to determine compliance of the comparator threshold. However, in many cases, the compliance threshold for the offset control loop does not need to be set accurately, and the sub-ADC bit decisions from only the immediately following stage are sufficient to implement the feedback. For example, in the case of four sub-ADC levels, the top and bottom comparator decisions can be used to indicate that the output voltage residue is out of range. Increasing the number of sub-ADC levels allows for tighter control of the residue range. This embodiment can simplify the digital logic requirements and reduce the feedback latency significantly.

Figure 3:
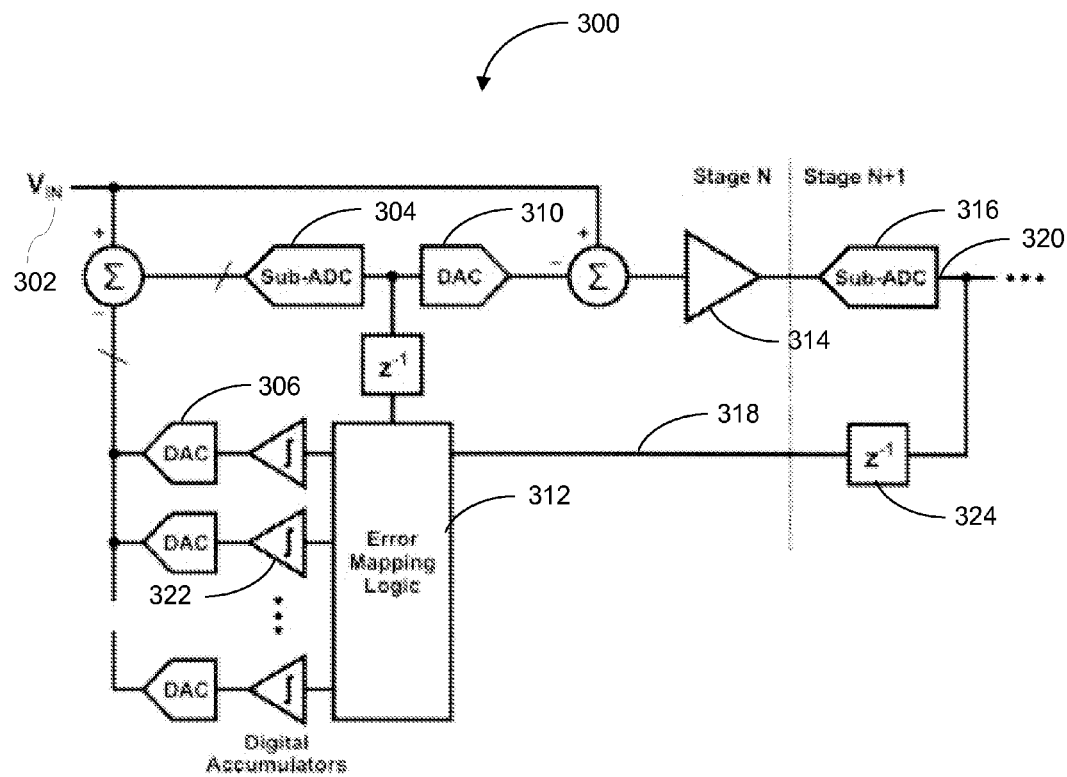
FIG. 3 is a block diagram of a sub-ADC comparator offset calibration according to various embodiments of the invention.

FIG. 3 is a block diagram of a sub-ADC comparator offset calibration 300 according to various embodiments of the invention. The output residue of stage N is quantized by, for example, sub-ADC 316 of subsequent stage N+1. The information exchanged back to stage N may comprise a full record of the output of sub-ADC 316 of subsequent stage N+1, only a subset thereof, or a combination of multiple subsequent digitization stages. For example, the information that stage N uses to make a decision may comprise only overflow and underflow status bits, where the status bits may or may not be used in the overall digitization of the ADC input signal.

In one embodiment, sub-ADC 304 comprises an array of comparators each having an independently controllable offset voltage that can be subtracted from analog input voltage signal 302, Vin. The comparator offset voltage is controlled by DAC 306 that is located in the feedback path of sub-ADC 304. The output of sub-ADC 304 is forwarded to DAC 310 that forms one input of an MDAC. The output of the MDAC is controlled by residue amplifier 314. The output of sub-ADC 304 is registered for use by error mapping logic 312. Error mapping logic 312 receives information, for example, from sub-ADC 316 of subsequent stage N+1 with pipeline delay 324 to determine which comparator's offset was too high or too low. The pipeline delay in the feedback path that is associated with the information fed back from stage N+1 is modeled as $z^{-1}$ block 324 in FIG. 3. Due to this latency, data from sub-ADC 304 of stage N is appropriately registered with error mapping logic 312 for proper alignment.

Error mapping logic 312 is coupled to the offset calibration loop that may increment and decrement the value of each DAC 310 in the digital domain via offset accumulator 322. The size and gain of digital accumulator 322 may vary depending on the particular implementation. To avoid a limit cycle oscillation in the offset control, digital offset accumulator 322 may have at least one more bit of precision than the offset control mechanism, or consecutive errors may be treated uniquely. Additionally, methods other than a simple accumulator may be used. Alternative methods may include, decimators, non-linear digital control techniques, and accumulate and dump. These methods may also be used to reduce power consumption. However, the amount of digital logic and power consumption is often negligible in advanced CMOS processes.

In one embodiment, there may be an effective systematic offset of all the comparators in sub-ADC 304. If analog input voltage 302, or an estimate of the analog input voltage 302, is sampled in such a way that there is a constant difference between the estimate and the actual input voltage 302, then a systematic offset can result between the output of sub-ADC 304 and the desired sub-ADC output. For example, this systematic offset can occur when analog input voltage 302 is equal to the output voltage of a previous stage's residue amplifier implemented with a two-phase zero-crossing detector circuit, and the input voltage 302 is sampled at the end of the first phase. When such a systematic offset occurs, multiple digital accumulators 322 and DAC 306 may be combined into a single offset control path.

Figure 4:
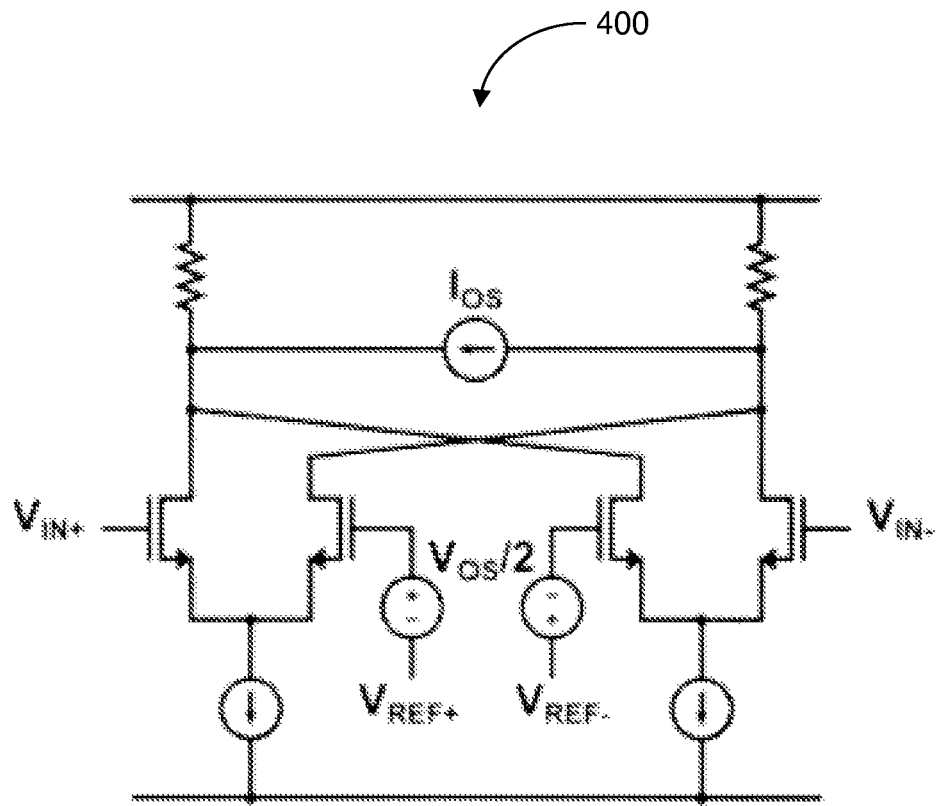
FIG. 4 is a prior art example of controlling the comparator offset through voltage or current.

Many techniques are available to those skilled in the art to digitally control or adjust a comparator's offset. These techniques may include the introduction of differential capacitance in the dynamic latch output load, differential current summation at the output of a comparator differential input pair, or controlling the reference voltage presented to the comparator. As an example, FIG. 4 illustrates two methods for adjusting the offset of a well-known fully-differential amplifier used as a preamplifier of a comparator circuit either in the voltage or current domain. The current offset $I_{OS}$ or the voltage offset $V_{OS}$ of the combination of both can be used to effectuate an offset referred to the input of the preamplifier.

Timing constraints within calibration processes are also addressed by various embodiments of the invention. Prior art solutions use a successive approximation register (SAR) algorithm for the sub-ADC to address timing mismatch between the MDAC sampling capacitors and the sub-ADC by combining the paths.

Figure 5:
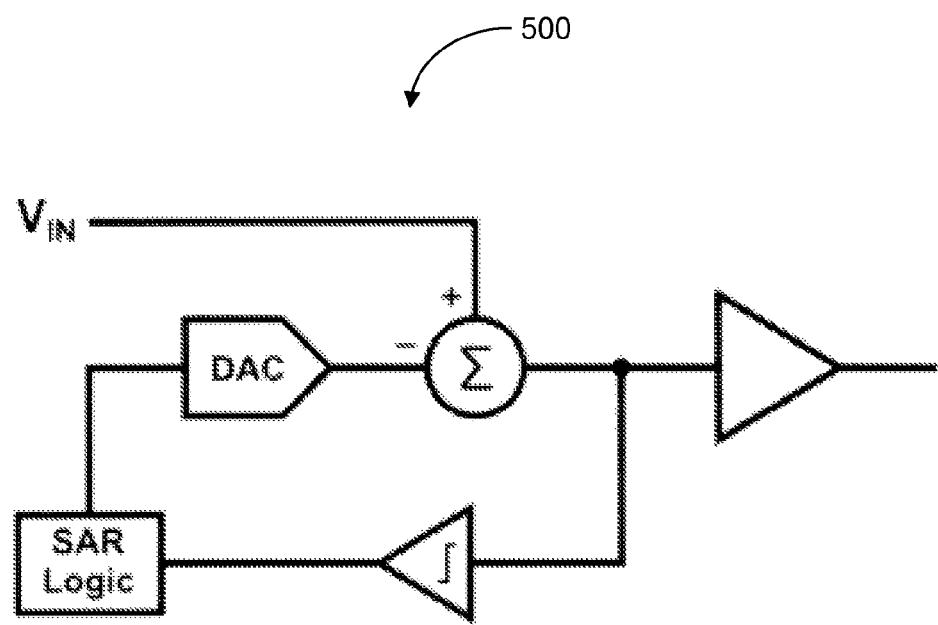
FIG. 5 is a prior art example of a pipeline stage using a SAR sub-ADC architecture to eliminate timing mismatch.

FIG. 5 shows a prior art example of a pipeline stage using a SAR sub-ADC architecture to eliminate timing mismatch. The MDAC capacitors used traditionally during the residue amplification phase are utilized for the SAR sub-ADC decisions as well. In this architecture, the trial reference charge derived from the sub-ADC decision is subtracted from the sampled charge through the MDAC, and the difference is presented to a single comparator. Multiple decisions are made by a successive approximation algorithm until the desired region for the residue amplification is reached. The disadvantage of such a SAR structure is that several decisions are required in series, which has a negative impact on the maximum operating frequency of the pipeline ADC. Therefore, it would be advantageous to provide tools that mitigate the timing mismatch with reduced impact on the pipeline maximum operating frequency.

Figure 6:
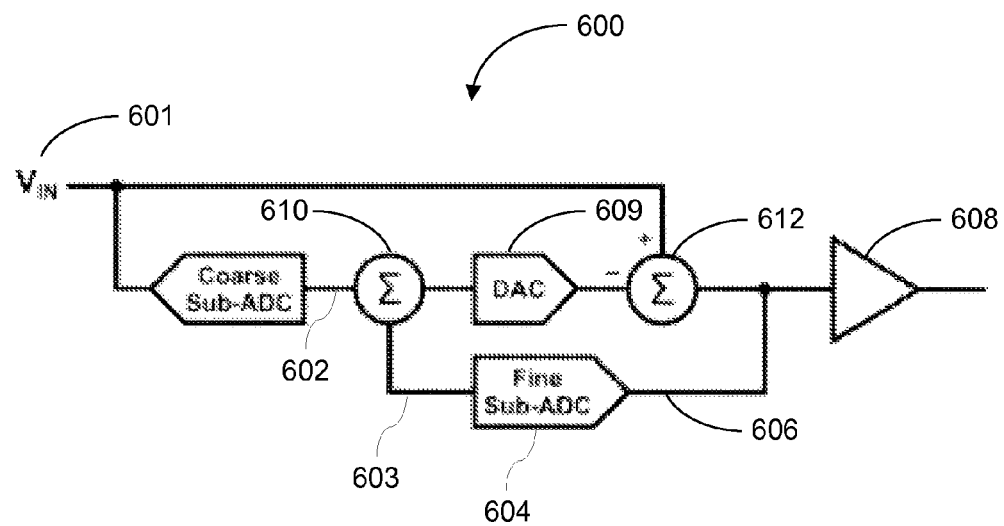
FIG. 6 is an exemplary block diagram of a coarse/fine sub-ADC to remove timing mismatch errors between sub-ADC and MDAC sampling operations according to various embodiments of the invention.

FIG. 6 is an exemplary block diagram of a coarse/fine sub-ADC to remove timing mismatch errors between sub-ADC and MDAC sampling operations according to various embodiments of the invention. In one embodiment, first, a coarse multilevel decision by a coarse flash sub-ADC estimates input signal 601, Vin, as coarse estimate 602. Assuming that fine estimate 603 is initially zero, DAC 609 applies a coarse reference charge to MDAC capacitors 612, thus subtracting the coarse estimate from the input signal and resulting in residue error 606. Second, fine decision 603 is made with fine sub-ADC 604 having one or more comparators whose inputs are coupled directly or indirectly to residue error 606. Fine decision 603 is then combined with coarse decision 602 either directly in the digital domain or in parallel with an equivalent DAC function, and residue error 606 is subsequently refined as presented to the input of residue amplifier 608. Although coarse estimate 602 of input signal 601 is sensitive to timing mismatch, fine decision 606 is based on the charge sampled by the MDAC capacitors and as a result fine decision 606 is not sensitive to timing mismatch. The range of correction in fine decision 606 should overlap the expected errors that result from both static and dynamic sources. Unlike the prior art structure shown in FIG. 1, the embodiment in FIG. 6 includes an additional comparison step to mitigate the timing mismatch. However, compared to the prior art SAR approach of FIG. 5, the additional comparison step in fine sub-ADC 604 provides several more bits in total for the sub-ADC decision. This results in time savings and a relatively higher maximum obtainable operating frequency over the prior art.

Figure 7:
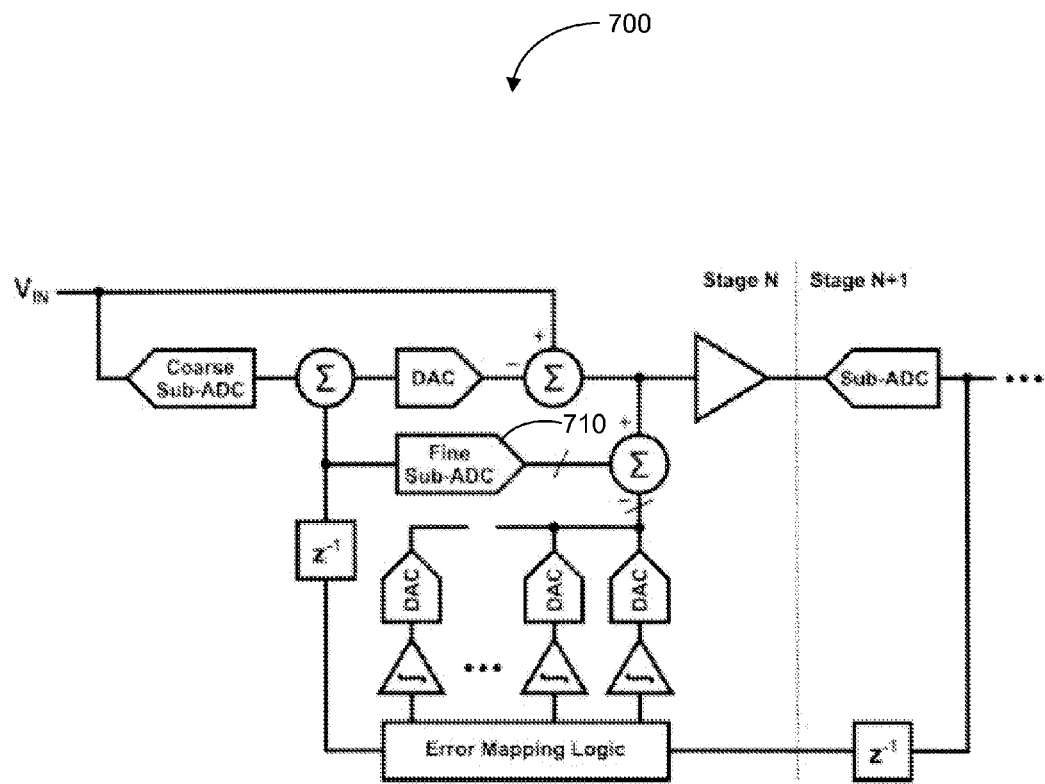
FIG. 7 is an exemplary block diagram of a coarse/fine sub-ADC for dynamic timing error and background calibration of the fine decision static errors according to various embodiments of the invention.

FIG. 7 is an exemplary block diagram of a coarse/fine sub-ADC for dynamic timing error and background calibration of the fine decision static errors 700 according to various embodiments of the invention. In one embodiment, fine decision comparator offsets of fine sub-ADC 710 may be calibrated in the foreground, by techniques known to those skilled in the art, in the background with the calibration technique discussed previously, or by any combination thereof. One skilled in the art will appreciate that the proposed background calibration technique may also be applied to the SAR sub-ADC architecture of FIG. 5. Limiting calibration to fine sub-ADCs 710 allows power and area to be optimized, since the variability in the coarse decisions can be corrected by the fine decisions, and the variability in the fine decisions can be calibrated. As a result, the transistor sizing for all comparators can be optimized to primarily increase speed with only a secondary regard for mismatch.

A benefit of the coarse/fine sub-ADC architecture is that the comparator offset calibration is used for only a relatively small number of comparators, resulting in a simple implementation of calibration. For large FLASH sub-ADC with 5-bits of resolution, having 6-bits of calibration for each comparator requires 2048 DAC elements ($2^5 \cdot 2^6$) and 192 flip-flops ($2^5 2^6$), which can be unwieldy both in terms of layout and digital content in a sensitive area of the ADC. For a 2-bit fine sub-ADC with the same number of calibration bits, only 256 elements ($2^2 \cdot 2^6$) and 24 flip-flops ($2^2 \cdot 6$) are required.

While it is advantageous to have overlap between the coarse and fine decisions, for noise reasons it is also helpful to minimize the number of capacitors required in the MDAC because any increase in MDAC capacitance increases noise at the output of the MDAC. Therefore, in one embodiment, instead of simply connecting the fine sub-ADC output to additional capacitors, MDAC capacitors are reused by modifying their state through digital logic, as shown in FIG. 8.

Figure 8:
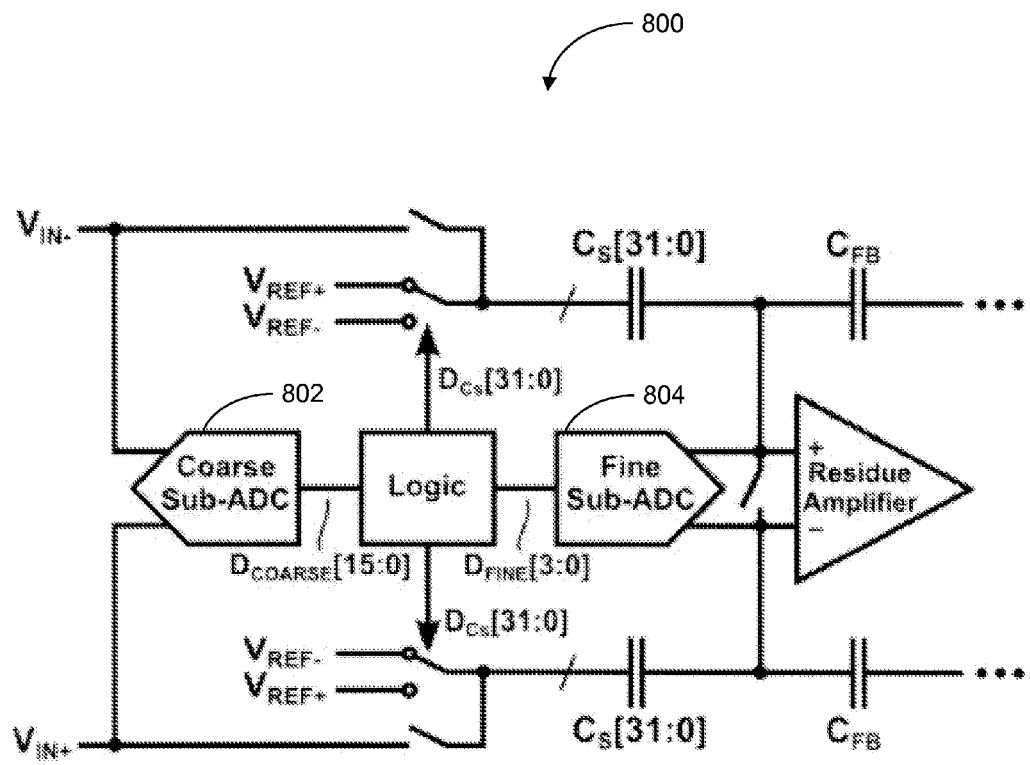
FIG. 8 is an exemplary block diagram of a coarse/fine sub-ADC configuration for 4.5-bit pipeline stage according to various embodiments of the invention.

FIG. 8 is an exemplary block diagram of a coarse/fine sub-ADC configuration for 4.5-bit pipeline stage according to various embodiments of the invention. In one embodiment, a 4.5-bit residue is constructed from 4-bit coarse sub-ADC 802 and 2-bit fine sub-ADC 804 with 1-bit of overlap redundancy. Coarse sub-ADC 802 makes a coarse-level decision with $N_{COARSE}$ decisions being equal to 1, and 16-$N_{COARSE}$ decisions being equal to 0, where $N_{COURSE}$ is the number of coarse comparators. Each of the 16 decisions maps to a pair of capacitors, such that $2N_{COARSE}$ capacitors of the positive polarity are connected to $V_{REF+}$ and 32-$2N_{COARSE}$ capacitors of the negative polarity are connected to $V_{REF-}$. The charge estimate of coarse sub-ADC 802 is then presented to fine sub-ADC 804 so that its decision ($D_{HNE}[3:0]$) can be made and the capacitor array connections can be correspondingly corrected.

Figure 10:
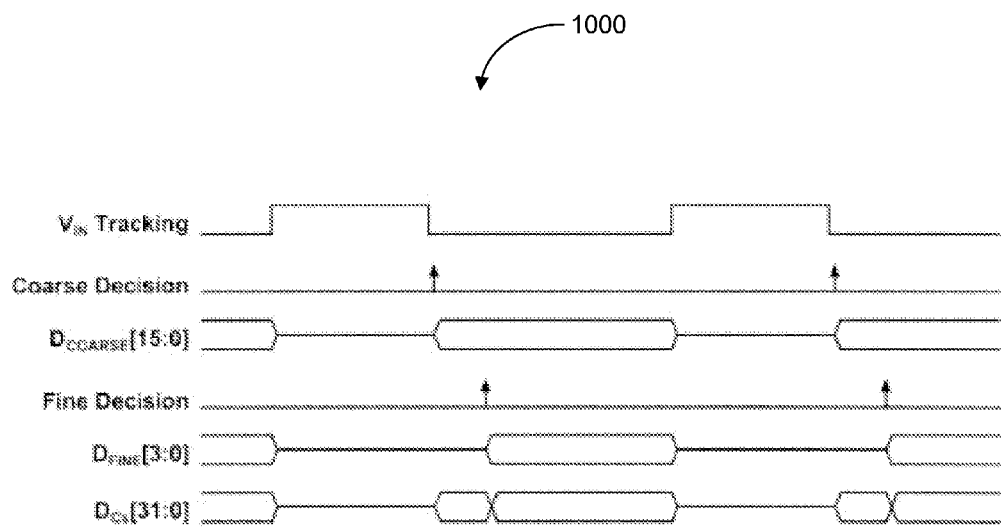
FIG. 10 is an exemplary timing diagram of a coarse/fine sub-ADC according to various embodiments of the invention.

A representative timing diagram is shown in FIG. 10 to illustrate the coarse and fine decision sequencing according to various embodiments of the invention. The analog input signal is tracked when "$V_{IN}$ tracking" is high, and then the input signal is sampled on the falling edge. A short time later, the coarse decision is made and $D_{COARSE}$ is made available to the MDAC such that the fine decision can be made after a suitable settling time. When $D_{HNE}$ has been made available, the final residue output voltage amplification can be completed in the remaining time in the half-clock period.

Figure 9:
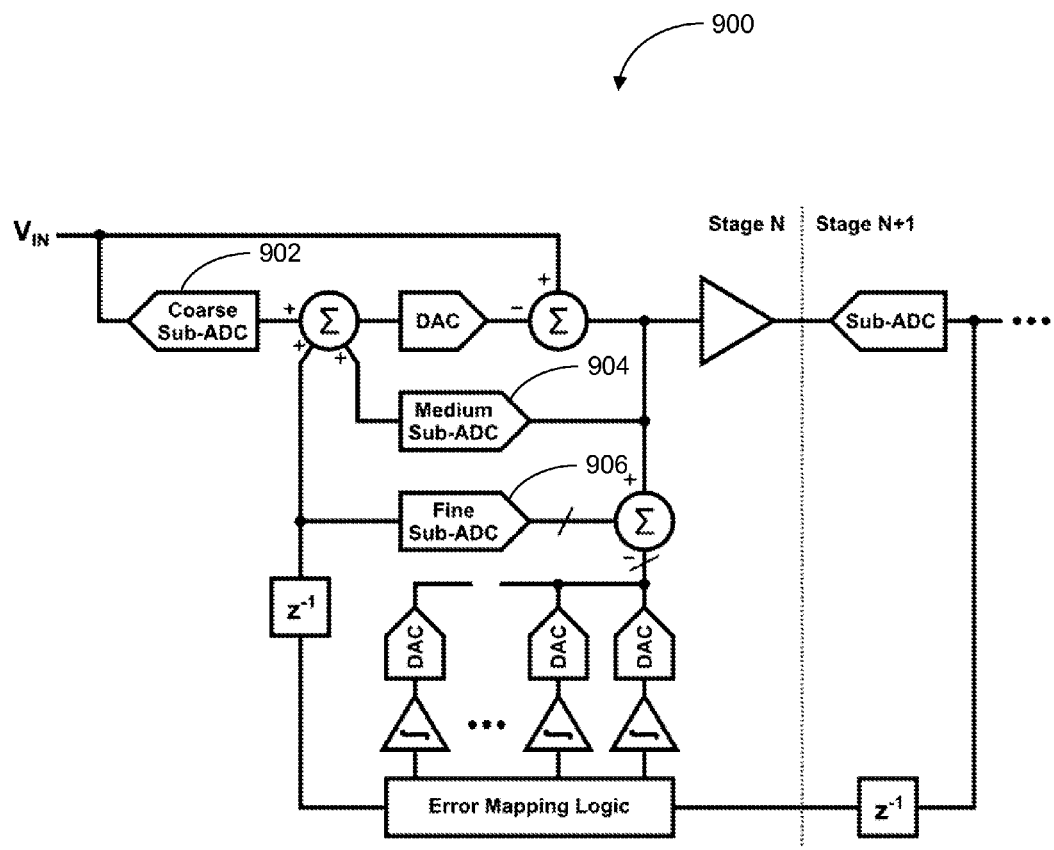
FIG. 9 is an exemplary block diagram of a coarse/medium/fine sub-ADC for dynamic timing error and background calibration of the fine decision static errors according to various embodiments of the invention.

In an alternative embodiment, as depicted in FIG. 9, there are three sequential bit-decisions made by coarse 902, medium 904, and fine 906 resolution sub-ADC. Although not required, it is desirable to have multiple levels or comparisons for each sub-ADC such that the final quantization estimate is approached in as few decisions as possible. This embodiment has the advantage of reduced hardware or number of comparators for each sequential decision with the disadvantage of a larger delay for the overall sub-ADC. In this embodiment, only the offsets of the fine decisions are calibrated. In other embodiments, the offsets for the medium decisions could additionally be calibrated by using the fine decisions of the same stage.

FIG. 11 is a table illustrating exemplary mapping of coarse and fine decisions to capacitor connections according to various embodiments of the invention. Considering the case $D_{FINE}[3:0]=4'b0011$, the capacitors are configured correctly and no modifications are required. If $D_{FINE}[3:0]=4'b00111$, this indicates that one capacitor with positive polarity needs to be connected to $V_{REF+}$ instead of $V_{REF-}$. If $D_{Cs}[31]$ is assigned to a 1 regardless of the coarse decision, then if $D_{Cs}[31]$ was equal to a 1 prior to the fine decision ($D_{COARSE}[15]==1$), this represents no change. However, this condition arises when the sampled input signal is larger than the ADC full-scale, which saturates the ADC and is an invalid condition. A similar assignment can be made for $D_{Cs}[30]$ in the case where $D_{FINE}[3:0]4'b1111$, and the same logic can be applied to $D_{Cs}[1]$ and $D_{Cs}[0]$ for the inverse conditions.

The proposed logical arrangement above is preferred to correcting the $D_{Cs}$ in precise order according to a strict 32-level thermometer code, as it simplifies the logic complexity and delay significantly. When calibration of capacitor mismatch is required this arrangement may present slightly more complexity to the calibration engine and logic. However, the calibration logic is not in the critical path for timing purposes, and the added complexity is very modest compared to the benefits of a simple mapping logic from the sub-ADC to the MDAC capacitors.

Although the example above demonstrates how 16 coarse levels and 4 fine levels are combined to represent 32 overall levels, it is understood that many combinations of the coarse and fine levels may be utilized. For example, due to the overlap between the coarse and fine levels, the designer may choose to omit the 2 extreme coarse decisions while maintaining precise determination of all 32 output cases. Also, the number of levels between coarse and fine decisions may be traded or balanced according to the application requirements. Finally, the final number of resulting levels is a design decision and is not constrained to 32 or any other number.

In one embodiment as shown in FIG. 8, a singular reference voltage is applied to both the fine sub-ADC and the residue amplifier. However, it is understood that additional switches connected to a fast-settling replica reference may be used in the time preceding and during the fine decisions. Such a replica reference may deliver the majority of charge required for the MDAC capacitor charging, and thus reduce the amount of reference charge delivered from the accurate reference source during the residue amplification. Alternatively, a singular reference voltage may be augmented between the coarse and fine decisions to aid in the coarse settling. However, imprecision in the reference source during the fine sub-ADC decision adds to variation in the output residue voltage range, and should be taken into account during design.

It is also understood that an offset may be presented to the sub-ADC comparators either intentionally or unintentionally during the fine decisions. This offset, provided that it is relatively consistent from sample to sample, is no different mathematically than the comparator offset itself, and will be removed by observing the resulting output residue voltage range as discussed. As an example, the output reset operation in a pipeline stage utilizing a zero-crossing detector may intentionally induce a systematic offset to the sub-ADC by connecting one $C_{FB}$ capacitor in FIG. 8 to the positive supply, and the other to the negative supply. This intentional offset can be utilized to ensure consistent or desired initial conditions during the residue amplification. Other uses for the time preceding the fine decision can be easily considered as well, including preparing the residue amplifier for amplification.

Because the residue amplifier and the fine decision comparators share information regarding an input signal, a pre-amplifier may be shared between the two functions. In this case the effective comparator offset would be reduced by the pre-amplifier gain. The pre-amplifier would need to be fully settled before the fine decisions could be made so as not to introduce a data-dependent variation in the comparator offset calibration loop.

While the background calibration of comparator offset and the use of a coarse/fine sub-ADC have clear benefits for pipeline ADC as described earlier, it is understood to those skilled in the art that other ADC architectures can benefit as well from the invention. For example, the background offset calibration technique proposed in this invention can also be applied to the SAR sub-ADC architecture of FIG. 5. Further, the coarse/fine approach may be suitable for the first decisions in a SAR ADC where the calibration of the fine decision can be calibrated by subsequent bit decisions, with or without use of a residue amplifier.

Figure 12:
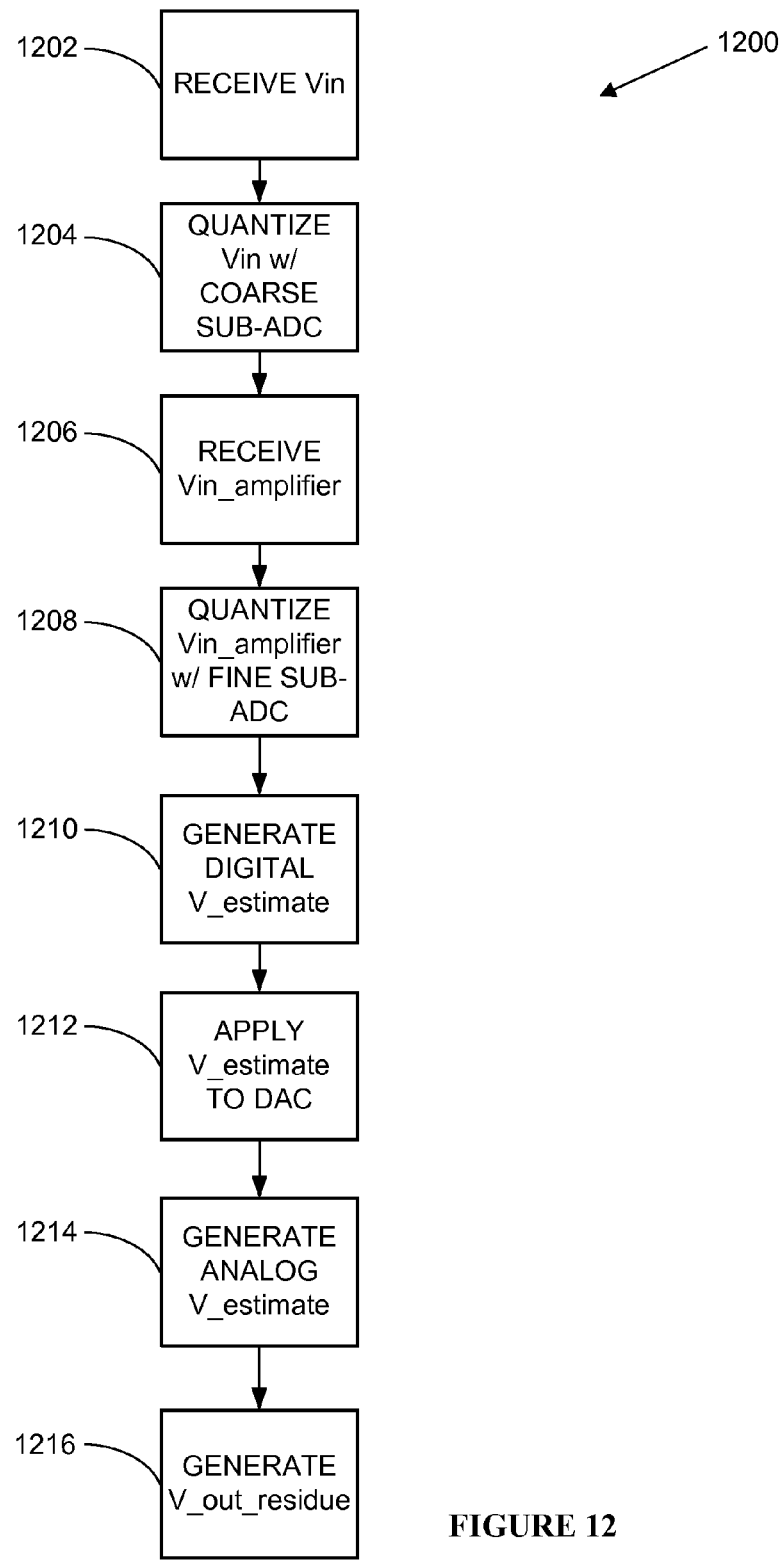
FIG. 12 is a flowchart of an illustrative process for a coarse/fine sub-ADC in accordance with various embodiments of the invention.

FIG. 12 is a flowchart of an illustrative process for a coarse/fine sub-ADC in accordance with various embodiments of the invention. At step 1202, an analog input voltage may be received by a coarse sub-ADC.

At step 1204, the analog input voltage is quantized by the coarse sub-ADC, which generated a digital estimate signal.

At step 1206, a fine sub-ADC receives a voltage taken from the input voltage of a residue amplifier to quantize it at step 1208. This quantized signal, at step 1210, is added to the quantized analog input voltage to generate a digital estimate voltage.

At step 1212, the digital estimate voltage is applied to a DAC, which, at step 1214, generates an analog estimate voltage therefrom.

At step 1216, the analog estimate voltage is subtracted from the analog input voltage in order to generate a residue output voltage, which may be amplified for further processing in a subsequent step. It is understood that the order of steps 1202-1216 is not critical to the present invention.

It will be appreciated to those skilled in the art that the preceding examples and embodiments are exemplary and are for the purposes of clarity and understanding and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention. It is, therefore, intended that the claims in the future non-provisional application will include all such modifications, permutation and equivalents as fall within the true spirit and scope of the present invention.

We claim:

1. An analog-to-digital converter (ADC) comprising:
a first sub-ADC stage comprising a sub-ADC, the first sub-ADC stage coupled to receive a variable analog input voltage and a first feedback signal, the first sub-ADC stage outputs an analog output voltage residue signal in response to the first feedback signal, the first feedback signal comprises a digital output code that is indicative of whether an offset voltage exceeds a predetermined value;
a second sub-ADC stage coupled to the first sub-ADC stage, the second sub-ADC stage quantizes the analog output voltage residue signal and generates the first feedback signal; and
an offset correction circuit to receive the first feedback signal and generate an offset signal that is subtracted from the variable analog input voltage and fed back to the sub-ADC.

2. The ADC according to claim 1, wherein the sub-ADC comprises a plurality of comparators.

3. The ADC according to claim 2, wherein the offset signal is applied systematically to the plurality of comparators.

4. The ADC according to claim 1, wherein the offset correction circuit further comprises:
an error mapping logic coupled to generate a plurality of control signals in response to the digital output code; and
a digital accumulator coupled to the error mapping logic, the digital accumulator increments or decrements the offset signal in response to the plurality of control signals, wherein the offset signal is independently controllable for one or more comparators in the first sub-ADC.

5. The ADC according to claim 1, wherein the offset correction circuit compromises a DAC.

6. The ADC according to claim 1, wherein the digital output code comprises a subset of sub-ADC levels from at least the second sub-ADC stage.

7. The ADC according to claim 6, wherein the subset of sub-ADC levels comprises over status and under status bits.

8. The ADC according to claim 6, wherein the digital output code comprises sub-ADC decisions from at least the second ADC stage.

9. The ADC according to claim 1, wherein the sub-ADC generates an output signal that is registered with the error mapping logic is sampled from the sub-ADC output signal.

10. An analog-to-digital converter (ADC) comprising:
a coarse sub-ADC coupled to receive an analog input voltage, the coarse sub-ADC generates a first estimate signal of the analog input voltage;
a multiplying digital-to-analog converter (MDAC) circuit coupled to receive the first estimate signal and a second estimate signal to generate an amplifier input voltage, the MDAC circuit comprises an amplifier and a first summer, the first summer subtracts an analog voltage from the analog input voltage to generate the amplifier input voltage;
a fine sub-ADC coupled to the input of the amplifier to generate a quantized signal from the amplifier input voltage; and
a second summer coupled between the coarse sub-ADC and the fine sub-ADC, the second summer couples the first estimate signal and the quantized signal to generate the second estimate signal, wherein an input-referred range of the fine sub-ADC is larger than a quantization step size of the coarse sub-ADC.

11. An analog-to-digital converter (ADC) comprising:
a first sub-ADC stage coupled to receive a variable analog input voltage and a first feedback signal, the first sub-ADC stage outputs an analog output voltage residue signal in response to the first feedback signal, the first feedback signal comprises a digital output code that is indicative of whether one or more offset voltages exceed a predetermined value, the first sub-ADC stage comprising:
a fine sub-ADC coupled to the feedback signal, the fine sub-ADC compensates for the offset voltage;
an offset correction circuit coupled to the fine sub-ADC, the offset correction controls the fine sub-ADC;
a multiplying digital-to-analog converter (MDAC) circuit coupled to receive a variable analog input signal and a coarse sub-ADC output signal to generate a second analog output voltage residue signal for the subsequent sub-ADC stage; and
a coarse sub-ADC coupled to receive the variable analog input signal, the coarse sub-ADC provides a reference charge to the MDAC circuit; and
a second sub-ADC stage coupled to the first sub-ADC stage, the second sub-ADC stage quantizes the analog output voltage residue signal and generates the first feedback signal.

12. The ADC according to claim 11, wherein the coarse sub-ADC is coupled to a capacitor array, and a decision of the fine sub-ADC is coupled to a subset of the capacitor array.

13. The ADC according to claim 11, wherein the fine sub-ADC is calibrated at a power up condition.

14. The ADC according to claim 11, wherein a set of MDAC capacitors are reused by modifying their state through digital logic.

15. The ADC according to claim 11, further comprising a residue amplifier that shares a common pre-amplifier with the fine sub-ADC.

16. The ADC according to claim 11, further comprising a medium sub-ADC coupled within the first sub-ADC stage.

17. The ADC according to claim 16, wherein the medium sub-ADC is calibrated by using the decision of the fine sub-ADC.

18. A method to calibrate for sub-ADC errors in an analog-to-digital converter (ADC), the method comprising:
receiving an analog input voltage;
generating a digital estimate voltage by summing a quantized analog input voltage and a quantized amplifier input voltage;
applying the estimate voltage to a DAC;
generating an analog estimate voltage from the digital estimate voltage;
generating a residue output voltage by subtracting the analog estimate voltage from the analog input voltage;
amplifying the residue output voltage;
quantizing the residue output voltage with a second sub-ADC;
generating a feedback signal to provide an estimate of a first sub-ADC error; and
applying the feedback signal to correct for the first sub-ADC error.

19. The method to calibrate for sub-ADC errors in the ADC of claim 18, the method further comprising performing a comparator offset calibration on a fine sub-ADC.

20. The method to calibrate for sub-ADC errors in the ADC of claim 19, wherein the performing of the comparator offset calibration further comprises receiving a digital output code from a subsequent sub-ADC stage.

21. The method to calibrate for sub-ADC errors in the ADC of claim 19, wherein the performing of the comparator offset calibration occurs in the background.

22. The method to calibrate for sub-ADC errors in the ADC of claim 19, wherein the performing of the comparator offset calibration involves a subset of comparators of the ADC.

23. The method to calibrate for sub-ADC errors in the ADC of claim 19, further comprising, prior to the performing of the comparator offset calibration, presenting an offset to at least a subset of sub-ADC comparators.

* * * * *